United States Patent
De Souza et al.

(10) Patent No.: US 10,158,039 B1
(45) Date of Patent: Dec. 18, 2018

(54) HETEROJUNCTION DIODE HAVING A NARROW BANDGAP SEMICONDUCTOR

(71) Applicant: International Business Machines Corporation, Armonk, NY (US)

(72) Inventors: Joel P. De Souza, Putam Valley, NY (US); Yun Seog Lee, Seoul (KR); Ning Li, White Plains, NY (US); Devendra Sadana, Pleasantville, NY (US); Yao Yao, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/784,384

(22) Filed: Oct. 16, 2017

(51) Int. Cl.
| | |
|---|---|
| *H01L 31/109* | (2006.01) |
| *H01L 31/0336* | (2006.01) |
| *H01L 29/861* | (2006.01) |
| *H01L 31/18* | (2006.01) |
| *H01L 31/0224* | (2006.01) |
| *H01L 29/66* | (2006.01) |
| *H01L 21/02* | (2006.01) |

(52) U.S. Cl.
CPC ...... *H01L 31/109* (2013.01); *H01L 29/66136* (2013.01); *H01L 31/022408* (2013.01); *H01L 31/0336* (2013.01); *H01L 31/18* (2013.01); *H01L 21/0228* (2013.01); *H01L 21/0262* (2013.01); *H01L 21/02178* (2013.01); *H01L 21/02549* (2013.01); *H01L 21/02554* (2013.01)

(58) Field of Classification Search
CPC ............ H01L 31/0328; H01L 31/0336; H01L 31/109; H01L 29/267; H01L 29/66136; H01L 29/66219; H01L 29/66969; H01L 29/8613
See application file for complete search history.

(56) References Cited

U.S. PATENT DOCUMENTS

| | | | |
|---|---|---|---|
| 8,653,460 B2 | 2/2014 | Vardi et al. | |
| 8,890,219 B2 | 11/2014 | Grenouillet et al. | |
| 8,969,986 B1 | 3/2015 | Yap et al. | |
| 9,324,813 B2 * | 4/2016 | DeSouza | H01L 29/267 |
| 9,653,870 B1 * | 5/2017 | Jiang | G02B 6/02395 |
| 9,673,252 B1 | 6/2017 | Crook et al. | |

(Continued)

FOREIGN PATENT DOCUMENTS

WO   2009151979 A2   12/2009

OTHER PUBLICATIONS

Alivov et al., Fabrication and characterization of n-ZnO/p-AlGaN heterojunction light-emitting diodes on 6H-SiC substrates, Applied Physics Letters, vol. 83, No. 23.*

(Continued)

*Primary Examiner* — Julio J Maldonado
*Assistant Examiner* — Molly Reida
(74) *Attorney, Agent, or Firm* — Garg Law Firm, PLLC; David M. Quinn

(57) ABSTRACT

A semiconductor device is formed using an n-type layer of Zinc Oxide, a p-type layer formed of a narrow bandgap material. The narrow bandgap material uses a group 3A element and a group 5A element. A junction is formed between the n-type layer and the p-type layer, the junction being operable as a heterojunction diode having a rectifying property at a temperature range, the temperature range having a high limit at room temperature.

19 Claims, 8 Drawing Sheets

(56) References Cited

U.S. PATENT DOCUMENTS

| | | |
|---|---|---|
| 9,722,033 B2* | 8/2017 | DeSouza ............... H01L 29/227 |
| 2008/0178924 A1 | 7/2008 | Kempa et al. |
| 2016/0093701 A1* | 3/2016 | DeSouza ............... H01L 29/267 |
| | | 257/43 |
| 2016/0190260 A1* | 6/2016 | DeSouza ............... H01L 29/267 |
| | | 257/43 |
| 2016/0240610 A1* | 8/2016 | de Souza ............. H01L 29/267 |
| 2016/0276528 A1 | 9/2016 | Kizhaev |
| 2016/0351728 A1* | 12/2016 | Kim .................. H01L 31/02002 |
| 2017/0005229 A1* | 1/2017 | Fogel ..................... H01L 33/30 |
| 2017/0179230 A1* | 6/2017 | de Souza ............. H01L 29/267 |
| 2017/0263788 A1* | 9/2017 | Kim .................. H01L 31/02002 |

OTHER PUBLICATIONS

E. Burstein, "Anomalous optical absorption limit in InSb," Physical Review, vol. 93, No. 3, 1954, pp. 632-633.

I. Shtrichman et al., "High operating temperature epi-InSb and XBn-InAsSb photodetectors." Proc. of SPIE, vol. 8353, 2012, 83532Y.

A. Evirgen et al., "InSb photodetectors with PIN and nBn designs," Proc. of SPIE, vol. 8993, 2013, 899313.

Chenming; Electrons and Holes in Semiconductors, p. 1 Thursday, Feb. 12, 2009.

J. Van Zeghbroeck; Temperature dependence of the energy bandgap, 1996, 1997.

* cited by examiner (PRIOR-ART)*

(PRIOR-ART)

HETEROJUNCTION DIODE HAVING A NARROW BANDGAP SEMICONDUCTOR

TECHNICAL FIELD

The present invention relates generally to a method, apparatus for fabricating a diode with a narrow bandgap semiconductor operating with rectifying properties at room temperature. More particularly, the present invention relates to a heterojunction narrow bandgap diode and a method of fabrication therefor.

BACKGROUND

A junction diode is a fundamental semiconductor device which presents low impedance for polarization above a threshold voltage in forward polarization (i.e. positive voltage applied to p-type semiconductor and negative voltage applied to n-type semiconductor), typically 0.6 V for silicon p-n diodes, and a much higher impedance in reverse polarization. Essentially, an ideal diode is an electrical conductor in one direction of current flow and an insulator in the opposite direction.

A photodetector diode is a diode which is conduction sensitive to light absorption. Photodetector diodes are constructed for response to light of specific ranges of wavelengths, including but not limited to visible, ultraviolet, and infrared. For example, x-ray detector and gamma-ray detector diodes conduct upon detecting other high-energy photons.

In solid-state physics, a band gap, also called an energy gap or bandgap, is an energy range in a solid where no electron states can exist. In graphs of the electronic band structure of solids, the band gap generally refers to the energy difference (in electron volts "eV") between the top of the valence band and the bottom of the conduction band in insulators and semiconductors. Bandgap is the minimum energy required to promote a valence electron bound to an atom in a solid to become a conduction electron, which is free to move within the crystal lattice and serve as a charge carrier to conduct electric current.

SUMMARY

The illustrative embodiments provide a method, device and photo-detector system. An embodiment takes the form of a semiconductor device. The embodiment includes an n-type doped Zinc Oxide layer and a p-type layer formed of a narrow bandgap material of elements from columns 3A and 5A of the periodical table. The embodiment includes a junction between the n-type layer and the p-type layer, the junction being operable as a heterojunction diode having a rectifying property at a temperature range, the temperature range having a high limit at room temperature. Thus, the embodiment provides a heterojunction diode that is operable at room temperature.

In another embodiment, the the element of group 3A is Indium, the element of group 5A is Antimony. Thus, the embodiment provides specific types of materials for the heterojunction diode that is operable at room temperature.

In another embodiment, the narrow bandgap material comprises Indium antimonide (InSb). Thus, the embodiment provides specific materials for the heterojunction diode.

In another embodiment, the p-type layer comprises a single crystal of the narrow bandgap material. Thus, the embodiment provides specific materials for the heterojunction diode.

In another embodiment, the n-type layer comprises Zinc Oxide doped with Aluminum. Thus, the embodiment provides specific materials for the heterojunction diode.

Another embodiment further includes a window structure, wherein the window structure allows light to reach the n-type layer. Thus, the embodiment provides additional structures for the heterojunction diode to be usable for photo-detection.

An embodiment includes a fabrication method for fabricating the semiconductor device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
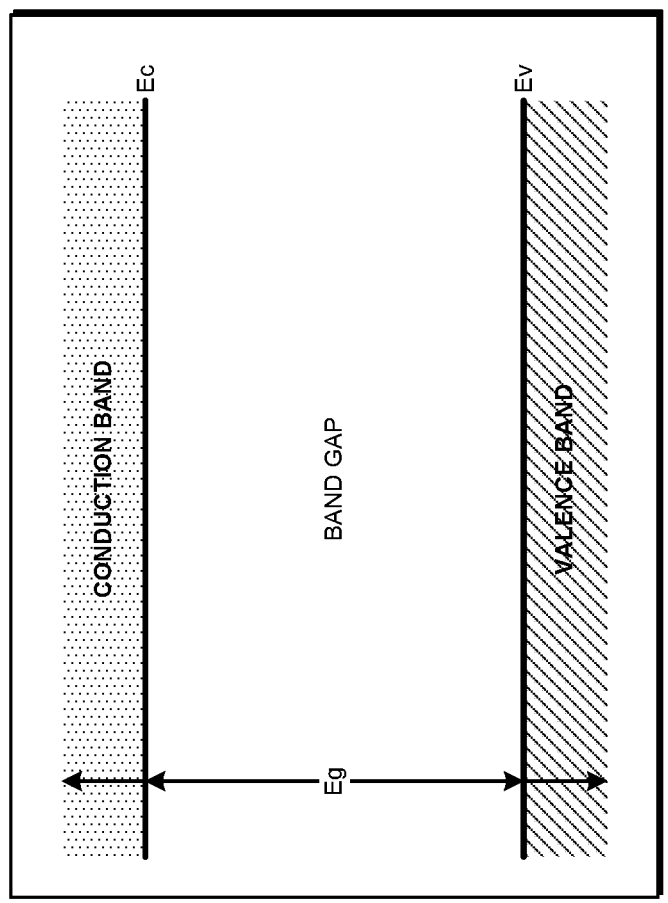
FIG. 1 depicts an energy band diagram of a semiconductor.

FIG. 1 depicts a simplified chart illustrating bandgap. Ev is the maximum energy level of the valence band of a material, Ec is the minimum energy level of the conduction band of the same material, and Eg is the energy gap—i.e., the bandgap energy—for an electron from the valence band to jump to the conduction band to make the material electrically conducting.

Figure 2:
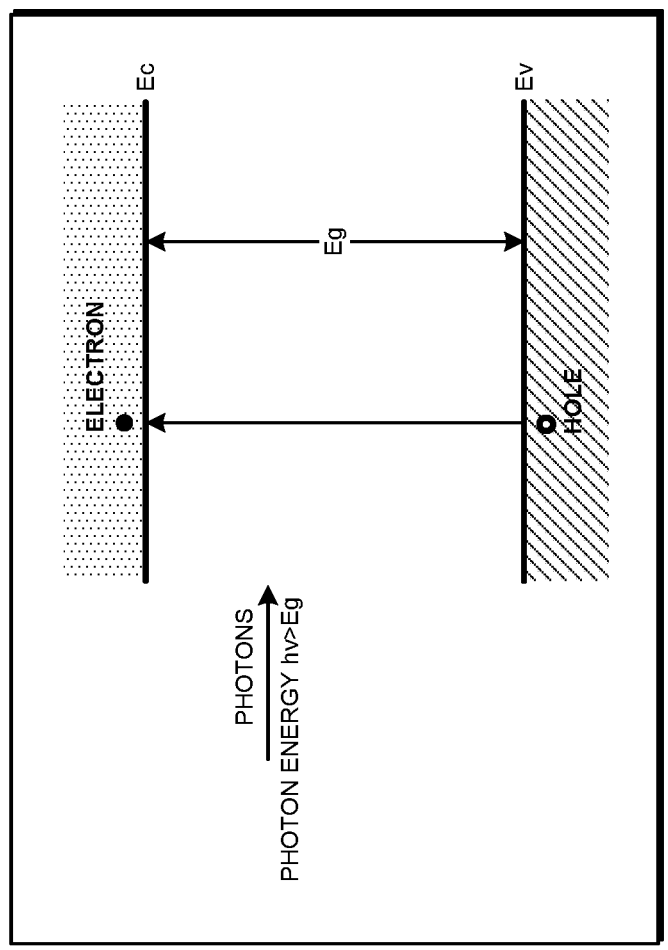
FIG. 2 depicts an energy band diagram for a photo-detector.

FIG. 2 depicts a chart of a photo-excited transition of the bandgap. An electron can jump from the valence band to the conduction band when the material is exposed to photons whose energy exceeds the bandgap Eg.

The illustrative embodiments recognize that diodes with narrow bandgap are desirable for long wavelength light, e.g., greater than 1 micron. Within the scope of the illustrative embodiments, a narrow bandgap is defined as less than 1 eV.

A bandgap that is not narrow (e.g., greater than 1 eV in some of the above examples), is a large or high bandgap. The narrower the bandgap, the less the energy required for the material to become conducting. In case of photo-detecting diodes, the narrower the bandgap the less energetic the photons are needed to trigger the diode into conduction.

Some narrow bandgap photo-detecting diodes are presently available. The illustrative embodiments recognize that the presently available photodetector diodes with a narrow bandgap are difficult to use because they require cooling to liquid nitrogen temperatures 77 Kelvin or −196 degrees Celsius (° C.)) for those diodes to reduce thermal carrier generation, and thus increase signal to noise ratio.

A diode comprises an electrical junction between a n-type material (also referred to n-doped material) and a p-type material (also referred to as p-doped material). The junction is referred to as a p-n junction.

The illustrative embodiments recognize that is desirable a p-n diode with a narrow bandgap semiconductor can present rectifier properties at room temperature, which enables detection of photons of long wavelengths at room temperature or without needing cooling to very low temperatures.

The illustrative embodiments used to describe the invention generally address and solve the above-described need for a heterojunction narrow bandgap diode to operate at low temperatures. The illustrative embodiments provide a fabrication method for a heterojunction diode employing a narrow bandgap semiconductor that presents a rectifier property at room temperature.

An apparatus according to an embodiment is a heterojunction diode formed by a large bandgap and a narrow bandgap semiconductors that can operate at room temperature and below. Another embodiment describes a fabrication method for the apparatus. An application implementing an embodiment can be configured as a modification of an existing semiconductor fabrication system—such as a photolithography system, as a separate application that operates in conjunction with an existing semiconductor fabrication system, a standalone application, or some combination thereof. For example, the application causes the semiconductor fabrication system to perform the steps of a method described herein, to fabricate a heterojunction narrow bandgap diode that can operate at room temperature, as described herein.

Only for the clarity of the description, and without implying any limitation thereto, the illustrative embodiments are described using a diode-type semiconductor device that uses the novel p-n junction described herein. An embodiment can be implemented with a different type of semiconductor device where narrow bandgap transition with low energy photo radiation is desired at room temperature, and such other semiconductor devices are contemplated within the scope of the illustrative embodiments.

Furthermore, simplified diagrams of the example p-n junction are used in the figures and the illustrative embodiments. In an actual fabrication, additional structures that are not shown or described herein, or structures different from those shown and described herein, may be present without departing the scope of the illustrative embodiments. Similarly, within the scope of the illustrative embodiments, a shown or described structure in the example semiconductor device may be fabricated from the same materials but using different methodologies to yield a similar operation or result as described herein.

Differently shaded portions in the two-dimensional drawing of the example structures, layers, and formations are intended to represent different structures, layers, and formations in the example fabrication, as described herein. The different structures, layers, and formations may be fabricated using the described materials or other suitable equivalents of the described materials so long as the equivalent materials exhibit the same or similar properties of the materials, the resulting device, or both, as described herein.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual photolithography to achieve an objective according to the illustrative embodiments.

Furthermore, the illustrative embodiments are described with respect to a specific actual or hypothetical semiconductor device only as an example. The steps described by the various illustrative embodiments can be adapted for fabricating a variety of planar and non-planar semiconductor devices in a similar manner, and such adaptations are contemplated within the scope of the illustrative embodiments. The specific contacts placements are also used only as non-limiting examples to describe the various operations of the illustrative embodiments. Those of ordinary skill in the art will be able to use an embodiment to similarly provide electrical access to the p-n junction for other purposes in other manners, and such adaptations are also contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating a heterojunction narrow bandgap photodetector diode that can operate at room temperature and below. Thus, a substantial advancement of such devices or data processing systems by executing a method of an embodiment is in an improved fabrication of a heterojunction with a narrow bandgap semiconductor with rectifying properties at room temperature and below.

The illustrative embodiments are described with respect to certain types of devices, electrical properties, structures, formations, layers orientations, directions, steps, operations, planes, structures, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 3:
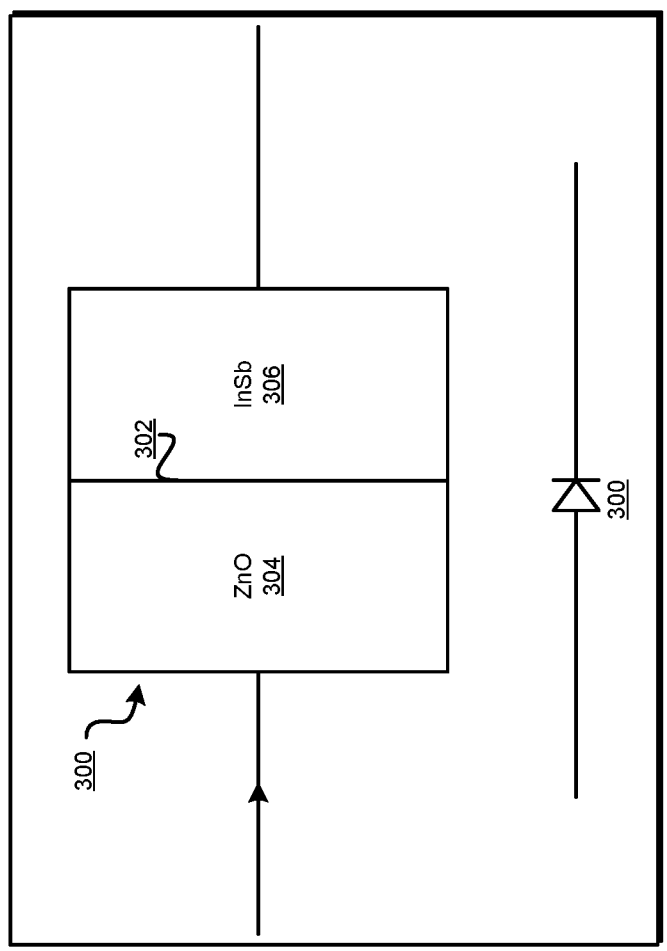
FIG. 3 depicts a block diagram schematic of an example diode formed using the p-n junction in accordance with am illustrative embodiment.

With reference to FIG. 3, this figure depicts a block diagram schematic of an example diode formed using the p-n junction in accordance with am illustrative embodiment. Diode 300 includes p-n junction 302. Junction 302 is formed using Aluminum doped Zinc Oxide (ZnO:Al or AZO) as n-type semiconductor material 304 and Indium antimonide (InSb) as p-type semiconductor material 306. Indium is a group 3A element in the periodic table, Antimony is a group 5A element in the periodic table. Other alloys comprising groups 2B and/or 3A and groups 5A and/or 6A elements can also be formed to exhibit behavior similar to that of InSb described herein. AZO was chosen because it is transparent to visible and to infrared light and has a higher band gap to allow the formation of a heterojunction.

The specific manner in which materials 304 and 306 are constructed to form junction 302 is implementation-specific and can be altered without departing the scope of the illustrative embodiments. An implementation using the specified materials of 304 and 306 to form junction 302 is within the scope of the illustrative embodiments even if (i) material 304 (or 306) is embedded, infused, doped, or otherwise mixed with other materials; (ii) additional structures, layers, materials are formed or used at or adjacent to junction 302; (iii) additional structures, layers, materials are formed or used on other sides other than the sides of material 304 (or 306) facing junction 302; or some combination thereof.

Figure 4:
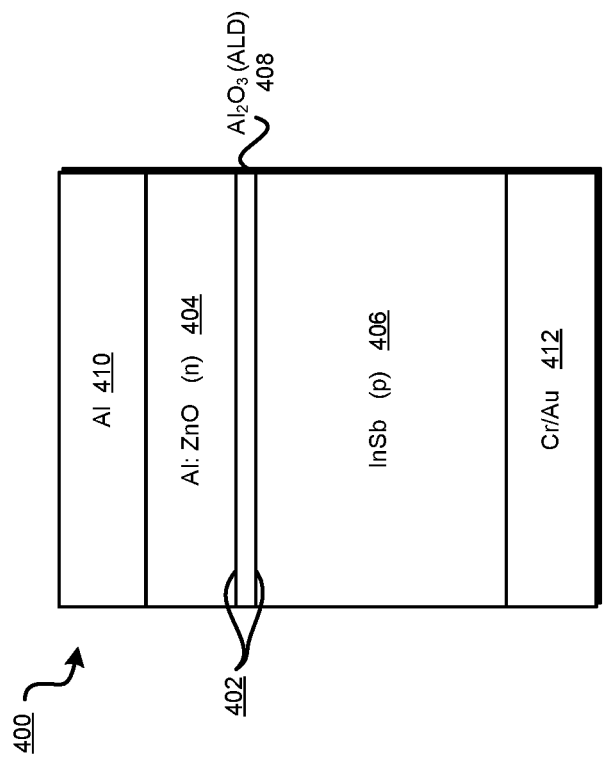
FIG. 4 depicts a schematic block diagram of an example implementation of a heterojunction narrow bandgap photo-detector diode that can be operated at room temperature in accordance with an illustrative embodiment.

With reference to FIG. 4, this figure depicts a schematic block diagram of an example implementation of a heterojunction narrow bandgap photodetector diode that can be operated at room temperature in accordance with an illustrative embodiment. Semiconductor device 400 is a more detailed example of diode 300 in FIG. 3. Semiconductor device 400 comprises layer 404 which includes ZnO doped with Aluminum (Al). One non-limiting example method of doping ZnO with Al is using atomic layer deposition (ALD) methodology. Material 406 includes InSb, doped with acceptor dopants like Be, Zn, or Cd.

Junction 402 is an example of junction 302 in FIG. 3. Junction 402 can be a formed by electrically bonding a surface of material 404 directly to a surface of material 406 to one another, as an alternative approach.

Optionally, a layer of a suitable material 408, e.g., Aluminum Oxide ($Al_2O_3$), can also be deposited at junction 402, e.g., using ALD, as an intervening layer between materials 404 and 406 to improve surface passivation of material 406 and thus improving the rectifying properties of the diode.

Layers 410 and 412 are optionally fabricated to enable contact placements. The contacts (not shown) placed on layers 410 and 412 are usable for electrically connecting semiconductor device 400 with other components in an electrical circuit. Layers 410 and 412 can be formed of any material or materials suitable for this purpose, and by using any suitable fabrication methodology. As some non-limiting examples, layer 410 is shown to be fabricated using Al, and layer 412 is shown as fabricated using a bi-layer comprising Chromium (Cr) and Gold (Au).

Figure 5:
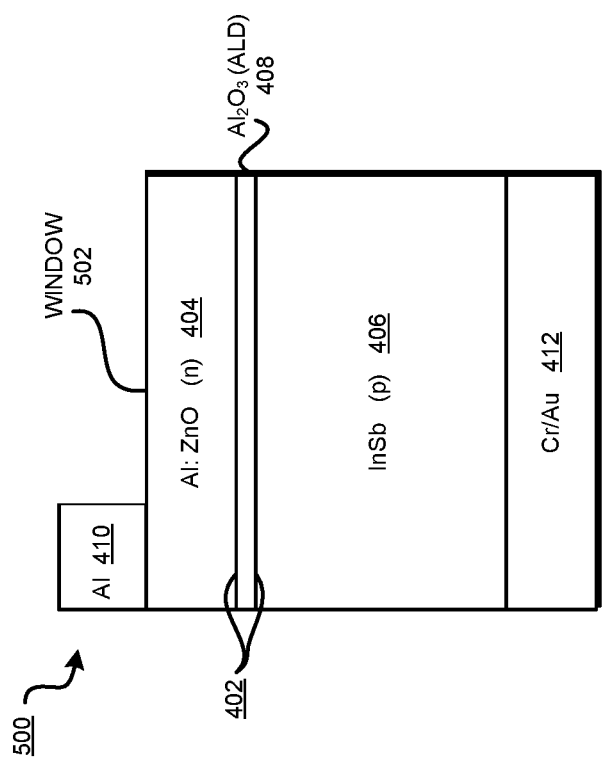
FIG. 5 depicts a schematic block diagram of another example implementation of a heterojunction narrow bandgap photodetector diode that can be operated at room temperature in accordance with an illustrative embodiment.

With reference to FIG. 5, this figure depicts a schematic block diagram of another example implementation of a heterojunction narrow bandgap photodetector diode that can be operated at room temperature in accordance with an illustrative embodiment. Semiconductor device 500 is an example of device 400 in FIG. 4, with a modification. In device 500, layer 410 is formed in a manner so as to create window 502. Essentially, window 502 is a suitable structure or an absence thereof, which allows light to reach layer 404. In the depicted non-limiting formation, window 502 is simply a gap in layer 410, through which light can pass and reach layer 406.

Figure 6:
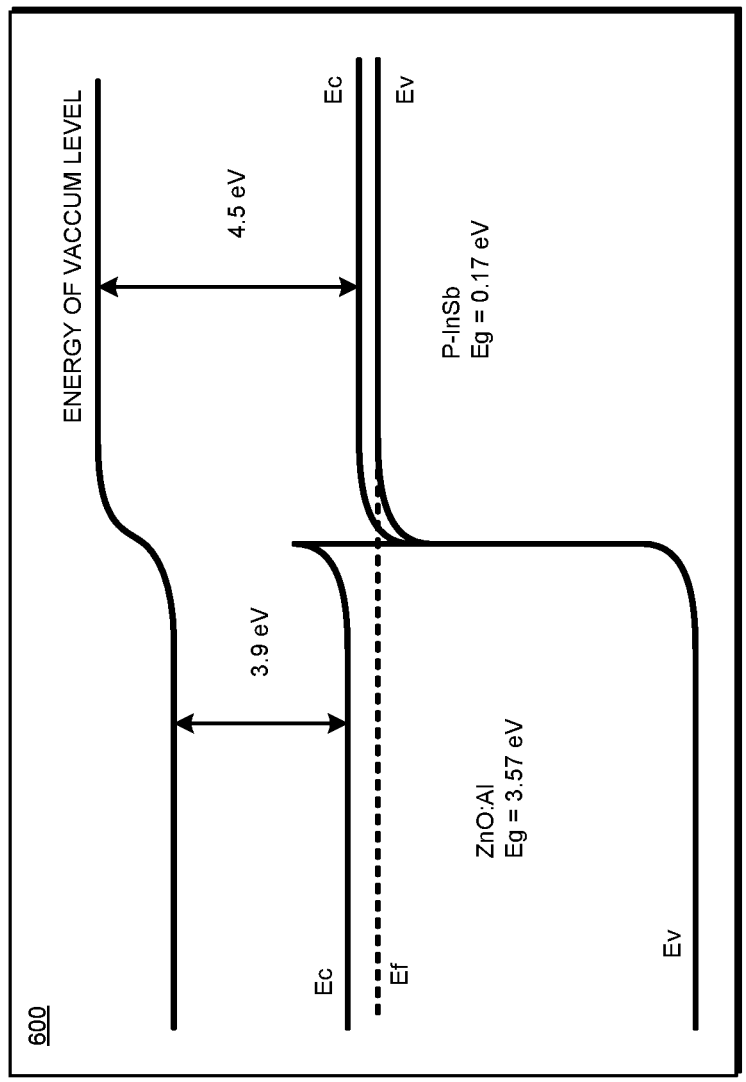
FIG. 6 depicts energy band diagram of the heterojunction formed by Al doped ZnO and p-type InSb at room temperature and in equilibrium in accordance with an illustrative embodiment.

With reference to FIG. 6, this figure depicts a likely energy band diagram of the heterojunction formed by Al doped ZnO and p-type InSb at room temperature and in equilibrium (layer 408 is not present), in accordance with an illustrative embodiment. An implementation of semiconductor device 400 or 500 was used in depicted plot 600. As can be seen, for layer 406, when constructed from p-type material InSb, advantageously provides a very narrow bandgap with Eg=0.17 eV at room temperature. When layer 406 is configured with layer 404 (ZnO doped with Aluminum having Eg=3.57 eV), the p-n hetero-junction thus formed is photo-triggered at 0.17 eV at room temperature.

Figure 7:
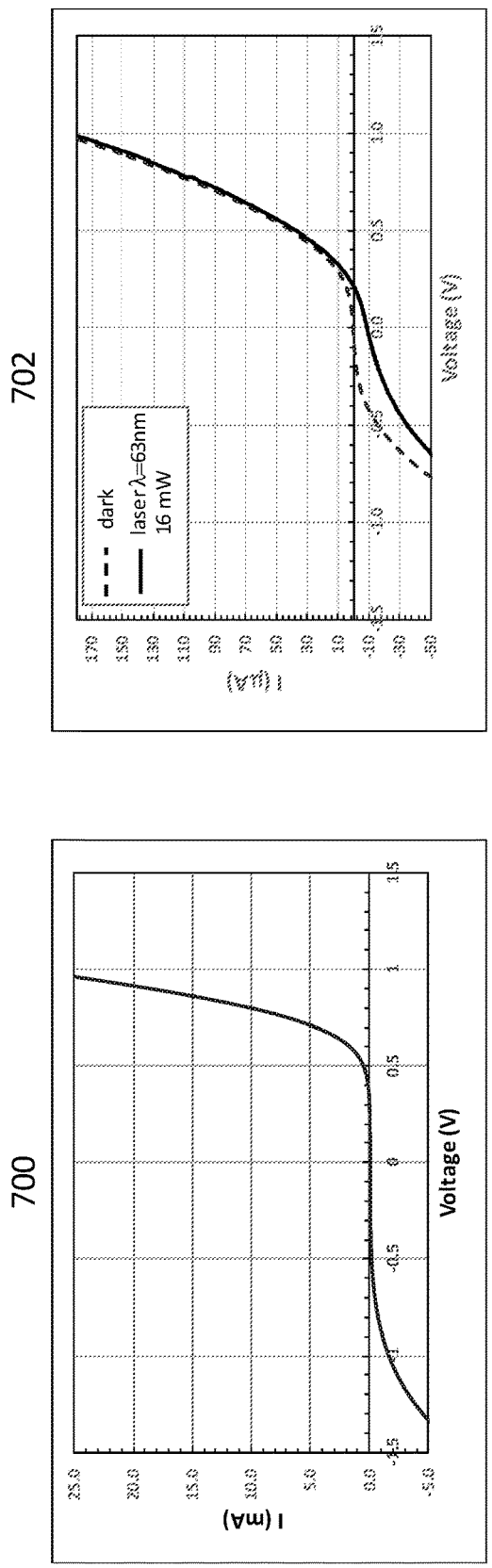
FIG. 7 depicts a graph of an operation of a heterojunction diode at room temperature in accordance with an illustrative embodiment.

With reference to FIG. 7, this figure depicts a graph of an operation of a heterojunction diode at room temperature in accordance with an illustrative embodiment. An implementation of semiconductor device 400 or 500 was used in the measurements taken at room temperature in the dark which are shown in plots 700. Plot 700 shows that semiconductor device 400 or 500 exhibits rectifying diode behavior. The leakage current (current through the device when the device is reversed polarized (i.e. positive voltage applied to n-type material) is also low for the narrow bandgap InSb diode. Measurements performed at room temperature for plot 702, in the dark and under illumination with visible light show desirable narrow bandgap photo-detection properties of device 400 or 500 using InSb as p-type material in layer 406. That photo-detection would extend to longer wavelengths in the Infrared region of spectrum, considering the narrow bandgap energy of the InSb. The specific implementations and measurements depicted in FIG. 7 are not intended to be limiting on the illustrative embodiments. Different measurements may be achieved with implementation-specific variations of an embodiment, but when layer 406 is configured with InSb as described herein, even the implementation-specific variations should exhibit room temperature narrow bandgap photo-detection performance comparable to that depicted in FIGS. 6 and 7 within industry-accepted tolerances.

Figure 8:
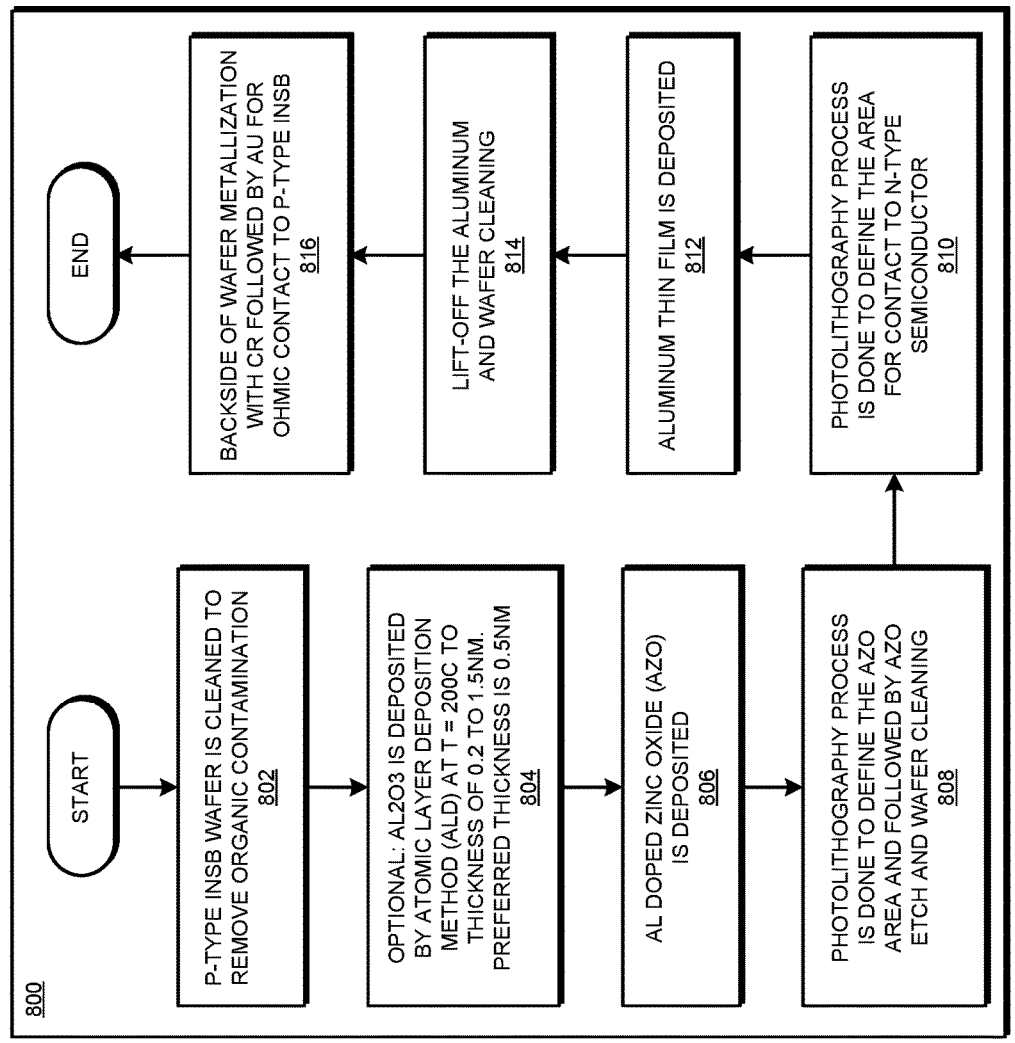
FIG. 8 a flowchart of an example process for fabricating a heterojunction narrow bandgap diode that exhibits photo-detection performance at room temperature in accordance with an illustrative embodiment.

With reference to FIG. 8, this figure depicts a flowchart of an example process for fabricating a heterojunction narrow bandgap diode that exhibits photo-detection performance at room temperature in accordance with an illustrative embodiment. Process 800 can be implemented as a method of fabrication that operates in conjunction with semiconductor fabrication system.

A p-type InSb wafer is cleaned to remove organic contamination (block 802). Optionally, $Al_2O_3$ is deposited by atomic layer deposition method (ALD) at temperatures from 100 degrees C. to 350 degrees C., T=200 degrees C. being a preferred temperature, to thickness of 0.2 to 1.5 nm (block 804). Preferred thickness is 0.5 nm.

Al doped Zinc oxide (AZO) is deposited (block 806). AZO is deposited by ALD at T=180 degrees C. to the thickness of 100 nm. AZO can also be deposited by sputtering. The ALD temperature could be in the range from 100 C to 300 C, the preferred temperature is 180 C. The thickness is not critical, and can be any thickness greater than 10 nm and less than few microns because the layer has to be transparent to visible and infrared light.

Photolithography process is done to define the AZO area and followed by AZO etch and wafer cleaning (block 808). Photolithography process is done to define the area for contact to n-type semiconductor (block 810). Aluminum thin film is deposited by thermal evaporation for contact to AZO (block 812). Alternative methods for thin film deposition include electron beam evaporation or sputter deposition. Al thickness is preferably in the range of 50 to 500 nm.

The aluminum is lifted-off and wafer cleaning is performed (block 814). Backside of wafer is metallized (block 816). Process 800 ends thereafter. The metallization of block 816 can be performed with Cr followed by Au for ohmic contact to p-type InSb. Chromium thickness is preferably 10 nm and Au thickness is preferably 50 nm. Cr is used to enhance Au adhesion. Au thickness is not critical and can be much thicker.

What is claimed is:

1. A semiconductor device, comprising:
   an n-type layer of Zinc Oxide doped with Aluminum;
   a p-type layer formed of a narrow bandgap material comprising a group 3A element and a group 5A element; and
   a junction between the n-type layer and the p-type layer, the junction being operable as a heterojunction diode having a rectifying property at a temperature range, the temperature range having a high limit at room temperature, wherein the room temperature is approximately 300 Kelvin (K).

2. The semiconductor device of claim 1, wherein the group 3A element is Indium, the group 5A element is Antimony.

3. The semiconductor device of claim 2, wherein the narrow bandgap material comprises Indium antimonide (InSb).

4. The semiconductor device of claim 1, wherein the p-type layer comprises a single crystal of the narrow bandgap material.

5. The semiconductor device of claim 1, further comprising:
   a window structure, wherein the window structure allows light to reach the p-type layer.

6. The semiconductor device of claim 5, wherein a material of the window comprises Al-doped ZnO.

7. A method comprising:
   forming, using a semiconductor fabrication system, an n-type layer of Zinc Oxide doped with Aluminum;
   forming, using the semiconductor fabrication system, a p-type layer formed of a narrow bandgap material comprising a group 3A element and a group 5A element; and
   forming, using the semiconductor fabrication system, a junction between the n-type layer and the p-type layer, the junction being operable as a heterojunction diode having a rectifying property at a temperature range, the temperature range having a high limit at room temperature, wherein the room temperature is approximately 300 Kelvin (K).

8. The method of claim 7, wherein the group 3A element is Indium, the group 5A element is Antimony.

9. The method of claim 8, wherein the narrow bandgap material comprises Indium antimonide (InSb).

10. The method of claim 7, wherein the p-type layer comprises a single crystal of the narrow bandgap material.

11. The method of claim 7, further comprising:
    a window structure, wherein the window structure allows light to reach the n-type layer.

12. The method of claim 11, wherein a material of the window comprises Al-doped ZnO.

13. The method of claim 7, wherein the heterojunction diode exhibits the rectifying property at the temperature range without requiring refrigeration.

14. The method of claim 7, further comprising:
    depositing, as a part of forming the junction, a layer of an interfacial material touching at least one of (i) a surface of the p-type layer, and (ii) a surface of the n-type layer.

15. The method of claim 14, wherein the interfacial material comprises Aluminum Oxide (Al2O3).

16. The method of claim 7, wherein the doped Zinc Oxide is deposited using Atomic Layer Deposition (ALD).

17. The method of claim 7, further comprising:
    depositing, on a surface of the n-type layer, a first metal, the surface being different from a second surface of the p-type layer, the second surface being used in the junction, and the metal being usable in forming an electrical connection with a first side of the junction.

18. The method of claim 7, wherein the heterojunction photo-detects visible light at the temperature range.

19. A semiconductor fabrication system comprising a lithography component, the semiconductor fabrication system when operated to fabricate a semiconductor device performing operations comprising:
    forming, using a semiconductor fabrication system, an n-type layer of Zinc Oxide doped with Aluminum;
    forming, using the semiconductor fabrication system, a p-type layer formed of a narrow bandgap material comprising a group 3A element and a group 5A element; and
    forming, using the semiconductor fabrication system, a junction between the n-type layer and the p-type layer, the junction being operable as a heterojunction diode having a rectifying property at a temperature range, the temperature range having a high limit at room temperature, wherein the room temperature is approximately 300 Kelvin (K).

* * * * *